United States Patent
Ohmae et al.

(10) Patent No.: US 9,804,215 B2
(45) Date of Patent: Oct. 31, 2017

(54) ELECTROMAGNETIC WAVE DETECTION APPARATUS

(71) Applicant: Hitachi, Ltd., Chiyoda-ku, Tokyo (JP)

(72) Inventors: Aya Ohmae, Tokyo (JP); Takashi Suga, Tokyo (JP); Umberto Paoletti, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/111,288

(22) PCT Filed: Mar. 3, 2014

(86) PCT No.: PCT/JP2014/055218
§ 371 (c)(1),
(2) Date: Jul. 13, 2016

(87) PCT Pub. No.: WO2015/132846
PCT Pub. Date: Sep. 11, 2015

(65) Prior Publication Data
US 2016/0334451 A1    Nov. 17, 2016

(51) Int. Cl.
*G01R 29/08*    (2006.01)
(52) U.S. Cl.
CPC ......... *G01R 29/0885* (2013.01); *G01R 29/08* (2013.01); *G01R 29/0878* (2013.01)
(58) Field of Classification Search
CPC ............... G01R 29/0814; G01R 29/08; G01R 29/0871; G01R 29/0885; G01R 29/0878; H01L 31/02165; G01N 2021/643
(Continued)

(56) References Cited

U.S. PATENT DOCUMENTS

| 5,243,186 A | * | 9/1993 | Hilliard | G01R 29/0885 250/227.17 |
| 5,625,368 A | * | 4/1997 | Howson | H01Q 1/247 343/753 |

(Continued)

FOREIGN PATENT DOCUMENTS

JP    6-334423 A    12/1994
JP    2005-110231 A    4/2005
(Continued)

OTHER PUBLICATIONS

M. Bosiljevac et al., "Non-Uniform Metasurface Luneburg Lens Antenna Design," IEEE Transactions on Antennas and Propagation, vol. 60, No. 9 (Sep. 2012), pp. 4065-4073.
(Continued)

*Primary Examiner* — Melissa Koval
*Assistant Examiner* — Trung Nguyen
(74) *Attorney, Agent, or Firm* — Crowell & Moring LLP

(57) ABSTRACT

The purpose of the present invention is to provide a small electromagnetic wave detection apparatus. This electromagnetic wave detection apparatus has: a planar Luneburg lens, which is covered with metal plates facing each other, and which changes the output direction of electromagnetic waves corresponding to the input direction of the electromagnetic waves; and an electric field sensor electrically connected to the metal plates. The electric field sensor detects the electromagnetic waves outputted from the Luneburg lens, and outputs a detection signal having an intensity corresponding to the direction in which the electromagnetic waves have traveled thereto, and the level of the energy of the electromagnetic waves thus detected.

11 Claims, 19 Drawing Sheets

(58) Field of Classification Search
USPC ........ 324/600, 629–633, 609, 300, 304–305, 324/200, 244.1, 750.23, 754.23; 343/701, 343/754, 911 L, 911 R
See application file for complete search history.

(56) References Cited

U.S. PATENT DOCUMENTS

| | | |
|---|---|---|
| 2011/0128016 A1 | 6/2011 | Yagitani et al. |
| 2011/0298111 A1 | 12/2011 | Kim |
| 2014/0347230 A1 | 11/2014 | Ohmae et al. |

FOREIGN PATENT DOCUMENTS

| | | |
|---|---|---|
| JP | 2009-141983 A | 6/2009 |
| JP | 2011-258920 A | 12/2011 |
| JP | 2013-130466 A | 7/2013 |
| WO | WO 2010/013408 A1 | 2/2010 |

OTHER PUBLICATIONS

International Search Report (PCT/ISA/210) issued in PCT Application No. PCT/JP2014/055218 dated Jun. 3, 2014 with English-language translation (four (4) pages).

\* cited by examiner

1:PLANAR LUNEBURG LENS

11:DIELECTRIC
12:WAVEGUIDE

0deg.

5deg.

10deg.

0deg.

5deg.

10deg.

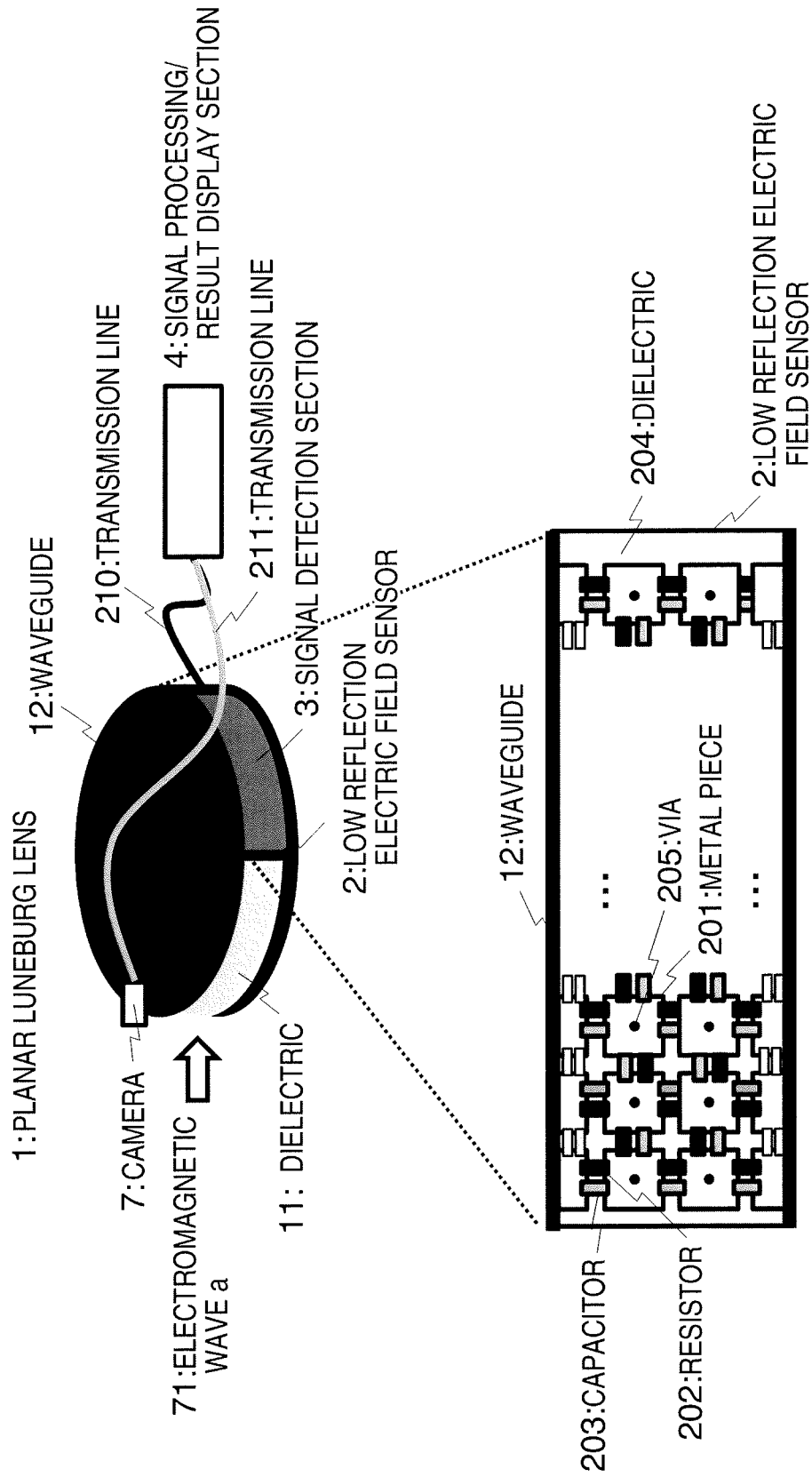

LEVEL LINE

ROTATED

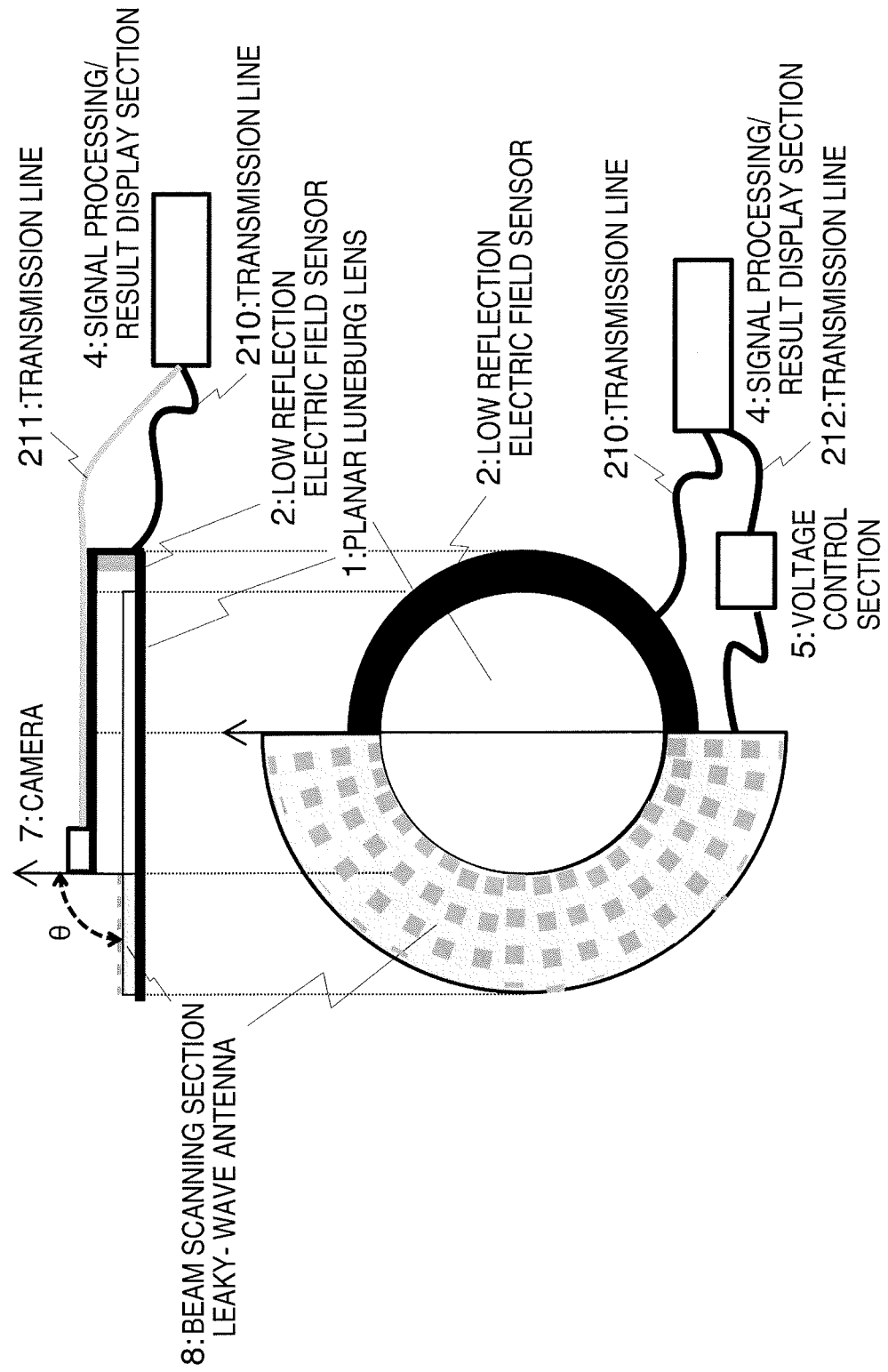

ELECTROMAGNETIC WAVE DETECTION APPARATUS

TECHNICAL FIELD

The present invention relates to an electromagnetic wave detection apparatus.

BACKGROUND ART

As various electronic apparatuses supporting society's infrastructures are made more functional, it is necessary that the speed and density of the electronic apparatuses are further increased. As a result, the electronic apparatuses need to be designed so that the electromagnetic noise emitted from the electronic apparatuses does not cause electromagnetic interference in the inside thereof or with other apparatuses. Further, when an electromagnetic interference problem occurs, the survey needs to be quickly performed on site. Therefore, an apparatus, which detects and visualizes the source of the electromagnetic noise in real time, is required.

As a technique which detects and visualizes electromagnetic waves, there are Patent Literature 1 (JP-A-2013-130466) and Patent Literature 2 (WO2010/013408). In Patent Literature 1, it is described that "an electromagnetic wave visualization apparatus includes: an emission direction separation section which changes the emission direction of electromagnetic waves according to the incident direction of the electromagnetic waves; a plurality of sensors, each of which senses the energy of electromagnetic waves emitted from the emission direction separation section and outputs a detection signal of the intensity corresponding to the amount of the sensed energy; a processing section which can receive the detection signal of each of the plurality of sensors, and which, when receiving the detection signal from the sensor, outputs a display signal including information on the arrival direction of electromagnetic waves, which information is obtained with reference to a table and on the basis of the position information of the sensor, from which the detection signal is transmitted; and a display section which can display each of the electromagnetic wave direction of arrivals, and which, when receiving the display signal, displays the electromagnetic wave direction of arrival on the basis of the electromagnetic wave direction of arrival information that is obtained from the sensor position information included in the display signal".

Further, in Patent Literature 2, there are described "a radio wave intensity measuring apparatus, and a radio wave intensity measurement system, each of which can measure the intensity of radio waves in a short time by including: a radio wave absorbing section provided with a plane having a plurality of cells that absorb radio waves incident on the plane; and a measurement section that measures the intensity of radio waves at the plurality of cells".

CITATION LIST

Patent Literatures

PATENT LITERATURE 1: JP-A-2013-130466
PATENT LITERATURE 2: WO2010/013408

Non Patent Literature

NON PATENT LITERATURE 1: "Non-Uniform Metasurface Luneburg Lens Antenna Design," M. Bosiljevac, M. Casaletti, F. Caminita, Z. Sipus, and S. Maci, IEEE Trans. Ant. and Prop. vol. 60, No. 9, pp. 4065-4073, 2012.

SUMMARY OF INVENTION

Technical Problem

With the technique described in Patent Literature 1, there is provided an apparatus which receives and visualizes the energy of electromagnetic waves by a two-dimensional electric field sensor using a spherical radio wave lens or an aspherical lens. In the configuration of Patent Literature 1, the size of the apparatus depends on the size of the lens, and hence, in order to secure the separation performance of electromagnetic waves, it is necessary to increase the lens diameter. Therefore, the size of the entire apparatus cannot be reduced.

Further, as a configuration of the receiving apparatus using a lens smaller than the spherical radio wave lens and the aspherical lens, there are a planar Luneburg lens and a receiving antenna as described in Non-patent Literatures 1. However, in this configuration, only one receiving section is provided, and hence, electromagnetic waves can be detected, but the direction of arrival of electromagnetic waves cannot be detected.

Further, as a configuration provided with a plurality of receiving sections, there is an EBG (Electromagnetic Band Gap) type electric field sensor as described in Patent Literature 2. This sensor, which is formed by periodically arranging metal pieces each sufficiently smaller than the wavelength of electromagnetic waves, is a kind of metamaterial equivalently having material properties that do not conventionally exist. The EBG type electric field sensor has a periodic structure which is formed of metal pieces and vias, and in which a resistor equivalent to the air wave impedance of 377Ω is connected between each adjacent pair of the metal pieces, to thereby realize the state where arriving electromagnetic waves are not reflected. However, in the above-described planar Luneburg lens, metal parallel plates are required at the top and bottom of the lens in order to control the characteristics of the lens. By the presence of the parallel plates, the number of periods in the periodic structure of the sensor arranged on the lens is limited, and hence it is difficult to realize the sensor having low-reflection. Further, since metal walls exist on the end portions of the periodic structure, the electromagnetic field is affected by the metal walls, and hence the low reflection state may be deteriorated.

Therefore, in view of the above-described problems, an object of the present invention is to provide a small electromagnetic wave detection apparatus.

Solution to Problem

In order to solve the above-described problems, the present invention adopts, for example, the configurations described in the appended claims.

This application includes a plurality of means for solving the above-described problems, but, as an example, there is provided an electromagnetic wave detection apparatus which is characterized by including: a planar Luneburg lens that is covered with metal plates facing each other and changes the emission direction of electromagnetic waves according to the incidence direction of the electromagnetic waves; and an electric field sensor electrically connected to the metal plate, and is characterized in that the electric field sensor detects electromagnetic waves emitted from the Luneburg lens, outputs the direction of arrival of the detected electromagnetic waves, and an intensity detection signal corresponding to the amount of energy of the electromagnetic waves.

Advantageous Effects of Invention

With the present invention, it is possible to provide a small electromagnetic wave detection apparatus.

BRIEF DESCRIPTION OF DRAWINGS

FIG. 14 is a view showing a configuration of an electric field sensor which is a sensor section according to a second embodiment of the present invention.

FIG. 22 is a view showing a configuration of a separation function in the elevation direction of radio waves according to a sixth embodiment of the present invention.

DESCRIPTION OF EMBODIMENTS

Embodiment 1

Figure 1:
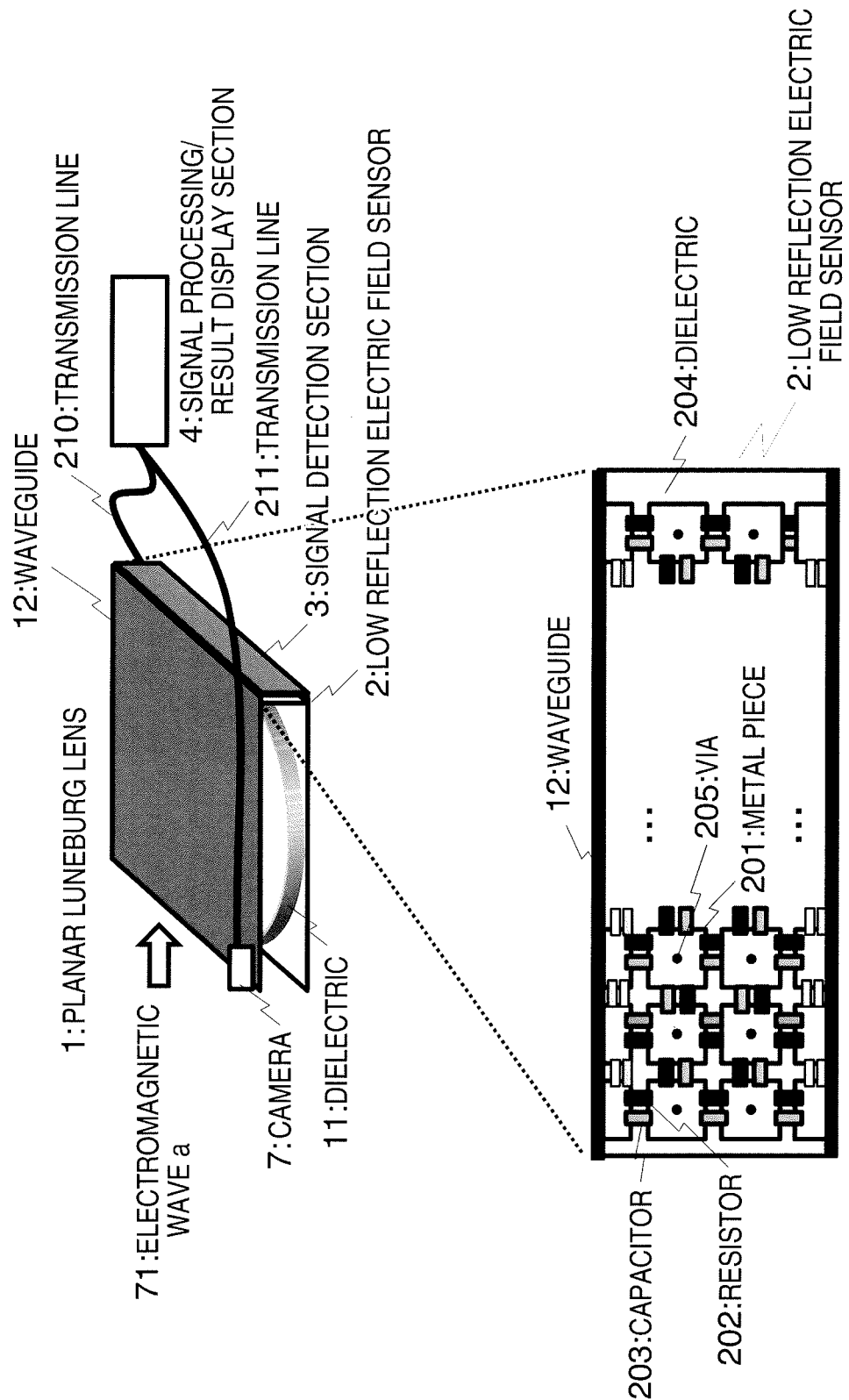
FIG. 1 is a view showing a configuration of an electromagnetic wave detection apparatus according to a first embodiment of the present invention.
Figure 2:
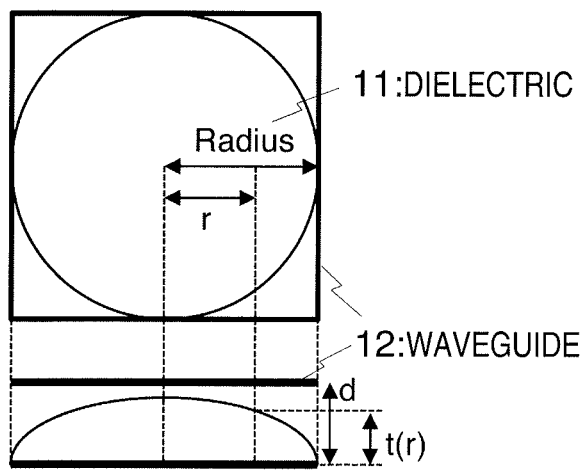
FIG. 2 is an overhead view and a sectional view of a plane electromagnetic wave lens according to the first embodiment of the present invention.
Figure 3:
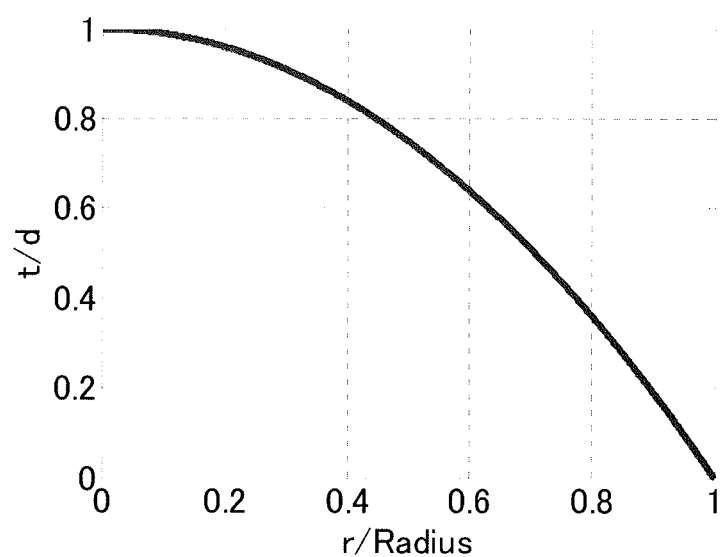
FIG. 3 is an example showing the thickness of the dielectric constant satisfying the effective dielectric constant of the planar electromagnetic wave lens according to the first embodiment of the present invention.
Figure 4:
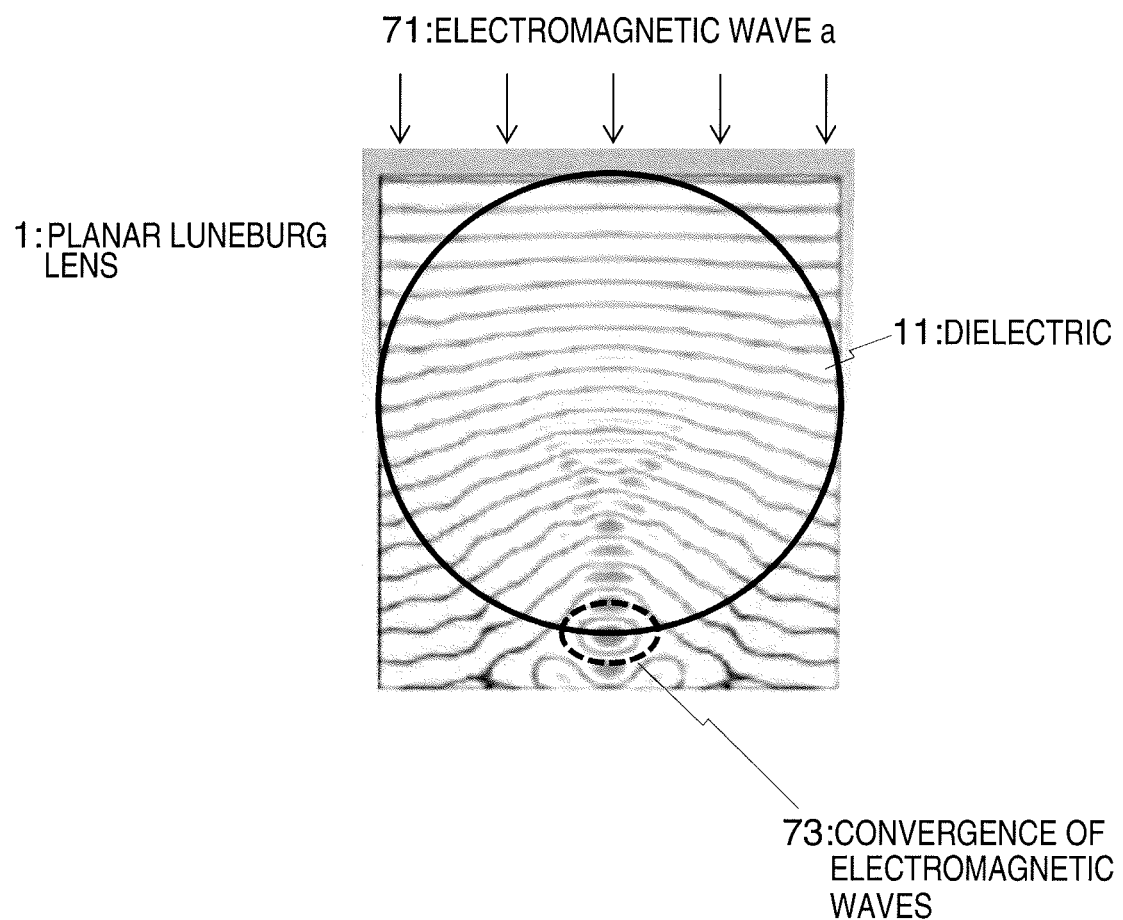
FIG. 4 is a view showing radio wave propagation characteristics of the planar electromagnetic wave lens according to the first embodiment of the present invention.
Figure 5:
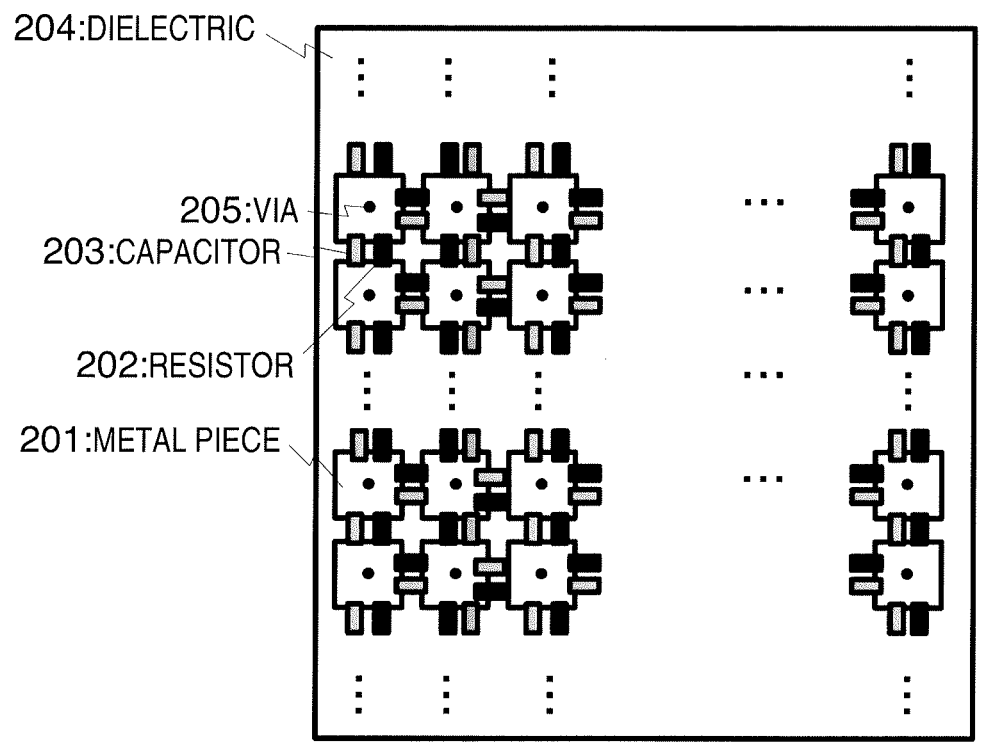
FIG. 5 is an overhead view of an electric field sensor according to the first embodiment of the present invention.
Figure 6:
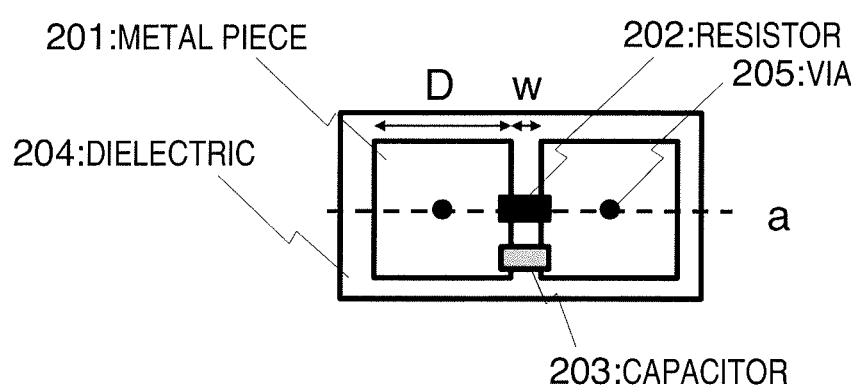
FIG. 6 is a partial overhead view of the electric field sensor according to the first embodiment of the present invention.
Figure 7:
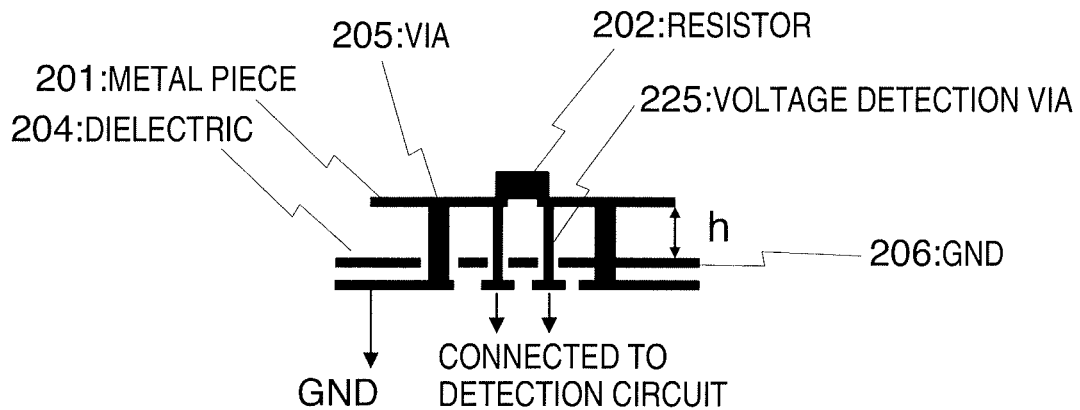
FIG. 7 is a partial sectional view of the electric field sensor according to the first embodiment of the present invention.
Figure 8:
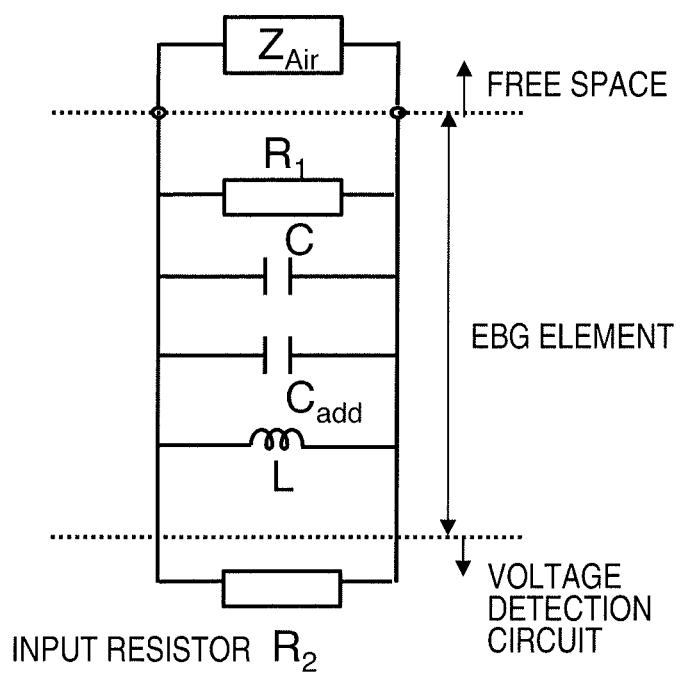
FIG. 8 is a view showing an equivalent circuit of the electric field sensor according to the first embodiment of the present invention.
Figure 9:
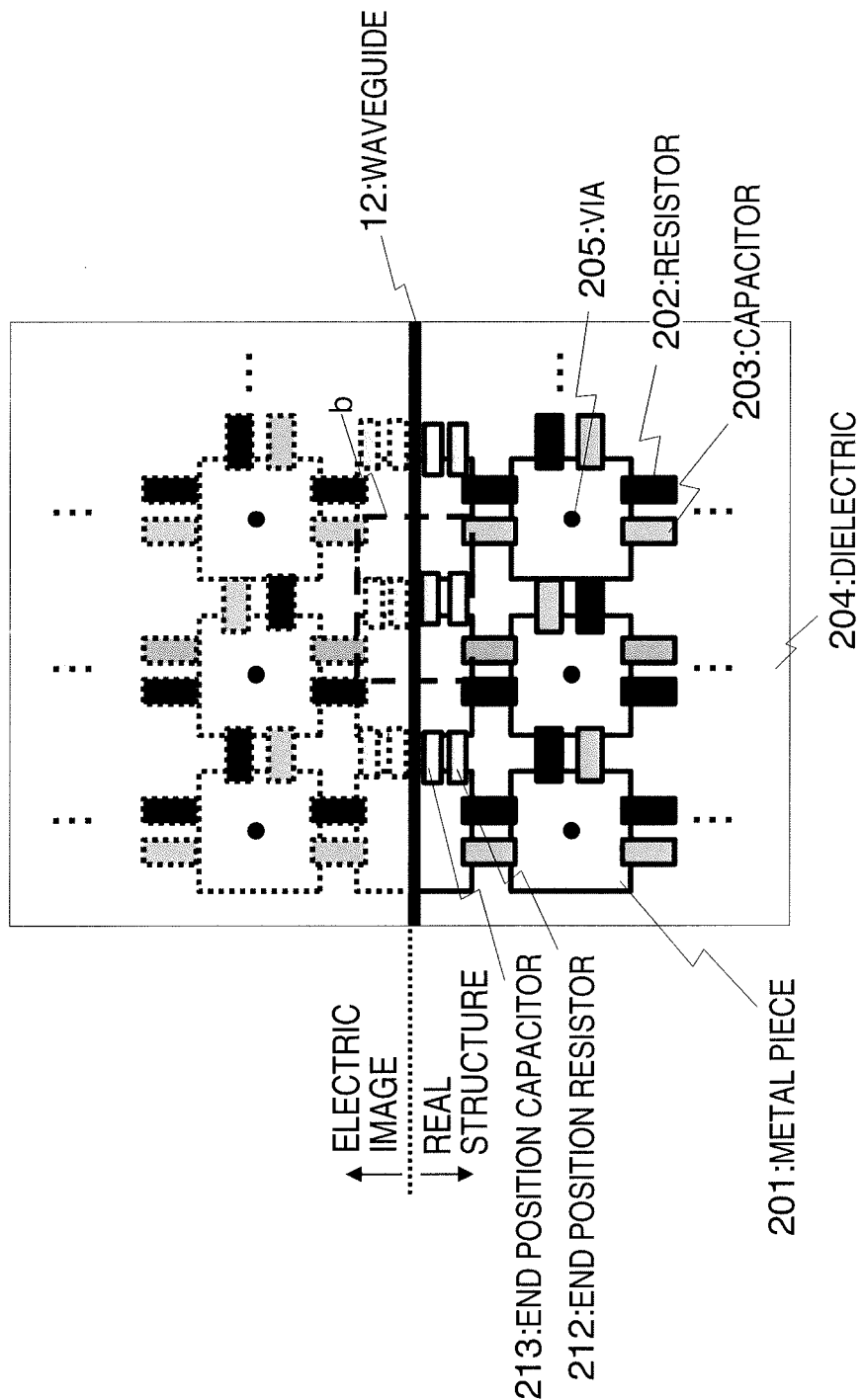
FIG. 9 is a detail view showing a substrate end portion of the electric field sensor which is the sensor section according to the first embodiment of the present invention.
Figure 10:
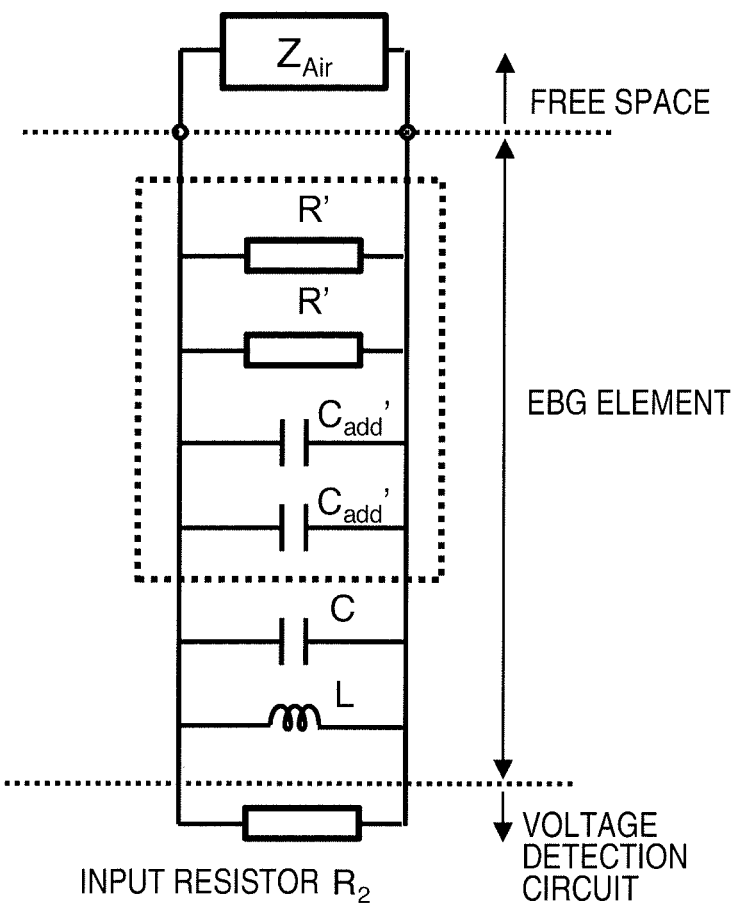
FIG. 10 is a view shows an equivalent circuit of the substrate end portion of the electric field sensor which is the sensor section according to the first embodiment of the present invention.
Figure 11:
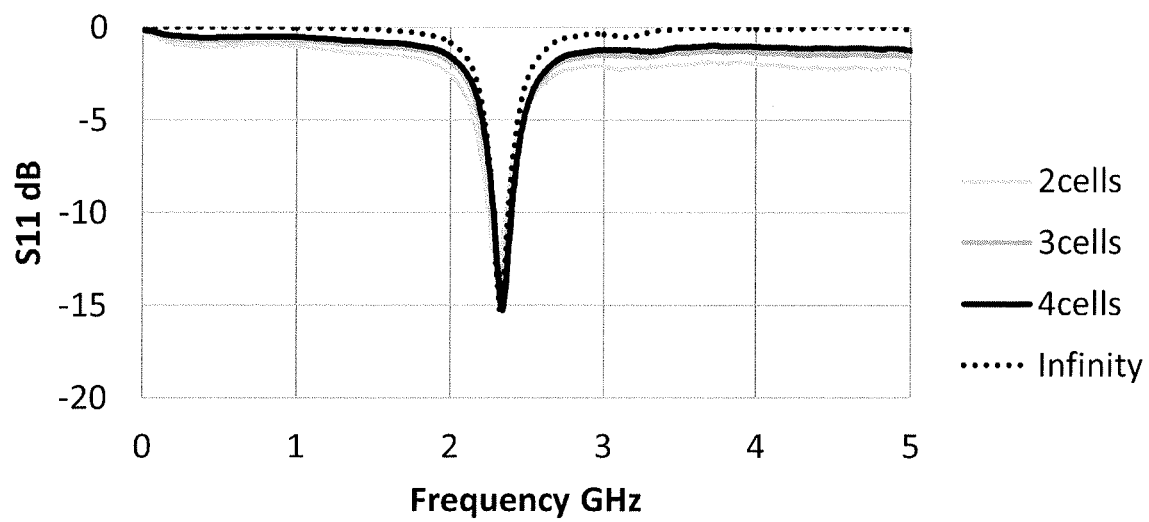
FIG. 11 shows analysis results of the electromagnetic wave reflection characteristics of the electric field sensor as the sensor section according to the first embodiment of the present invention.
Figure 12A:
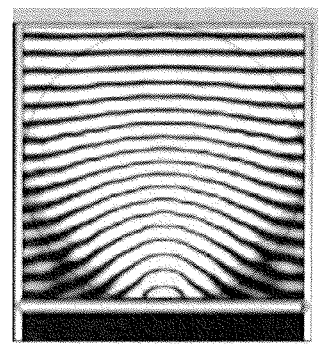
FIGS. 12A-12C show analysis results of electromagnetic wave propagation characteristics when the planar lens is combined with the electric field sensor which is the sensor section according to the first embodiment of the present invention.
Figure 12B:
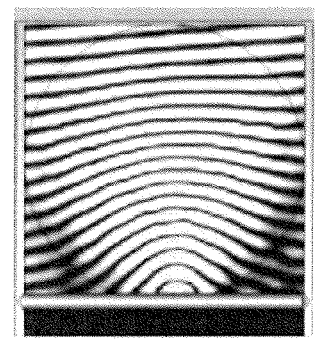
Figure 12C:
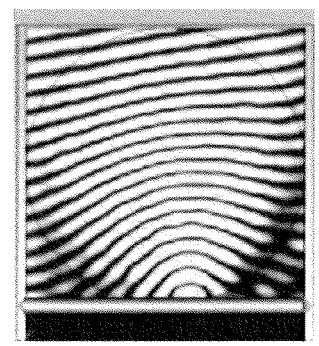
Figure 13A:
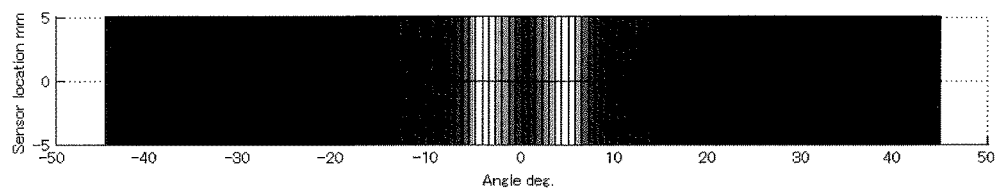
FIGS. 13A-13C show an example of estimated result of the direction of arrival of electromagnetic waves when the planar lens is combined with the electric field sensor which is the sensor section according to the first embodiment of the present invention.
Figure 13B:
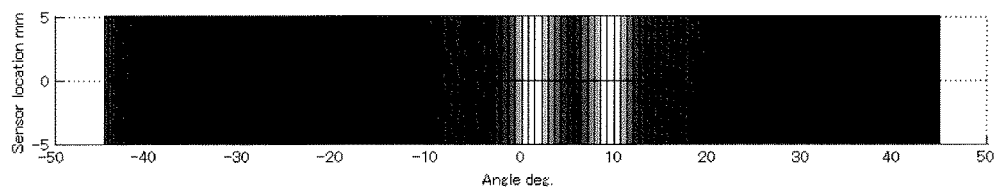
Figure 13C:
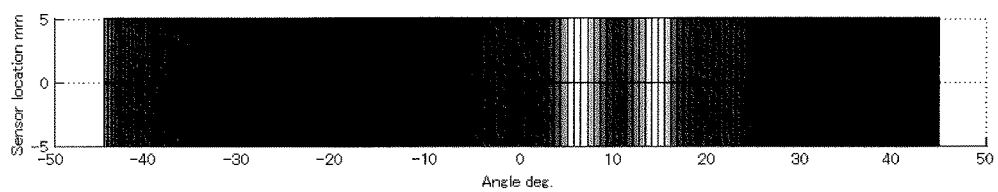

In Embodiment 1, a configuration of an electromagnetic wave detection apparatus provided with a configuration for visualizing electromagnetic waves will be described with reference to FIG. 1 to FIG. 13. FIG. 1 is a view showing a configuration of an electromagnetic wave detection apparatus according to the present embodiment. FIG. 2 shows a two-dimensional Luneburg lens of an direction of arrival separation section of the electromagnetic wave detection apparatus according to the present embodiment. FIG. 3 is a view showing the thickness of a dielectric of the Luneburg lens according to the present embodiment. FIG. 4 shows an example of electromagnetic field analysis of radio wave propagation characteristics of the Luneburg lens according to the present embodiment. FIG. 5 shows an example of an ideal configuration of an electric field sensor according to the present embodiment. FIG. 6 shows a partial overhead view of the electric field sensor according to the present embodiment. FIG. 7 shows a partial sectional view of the electric field sensor according to the present embodiment. FIG. 8 shows an ideal equivalent circuit of the electric field sensor according to the present embodiment. FIG. 9 shows an example of a configuration of a substrate end portion of the electric field sensor according to the present embodiment. FIG. 10 shows an equivalent circuit of the substrate end portion of the electric field sensor according to the present embodiment. FIG. 11 is a view showing reflection characteristics of the electric field sensor according to the present embodiment. FIG. 12 shows an example of analysis results of propagation characteristics of electromagnetic waves when the planar Luneburg lens is combined with the electric field sensor according to the present embodiment. FIG. 13 shows an example of visualization of the direction of arrival of electromagnetic waves when the planar Luneburg lens is combined with the electric field sensor according to the present embodiment.

As shown in FIG. 1, in the present embodiment, an electromagnetic wave detection apparatus includes planar Luneburg lens 1 which is an emission direction separation section having a function of separating multiple incident electromagnetic waves with different direction of arrivals, and is provided with waveguide 12 covering one surface of the lens 1.

Electric field sensor 2, which is provided with a plurality of sensors each inducing a voltage according to the energy of electromagnetic waves, is connected to one end of waveguide 12 so as to cover one side surface of plane Luneburg lens 1.

Electric field sensor 2 has a plurality of metal pieces 201 on dielectric 204, and metal pieces 201 adjacent to each other are connected to each other by resistor 202 and capacitor 203. Further, via 205 is provided at the central portion of metal piece 201. The detail configuration of the sensor will be further described below.

Signal detection section 3, which detects a signal from electric field sensor 2, is connected to electric field sensor 2, and signal processing/display section 4 is connected to signal detection section 3 via transmission line 210. Further, in the electromagnetic wave detection apparatus, camera 7 for capturing an image of an object is provided to be connected to signal processing/display section 4.

Signal processing/display section 4 includes a signal processing section which processes image information from camera 7 and a detection signal, and a display section which displays processing results and the like. Here, the signal processing section and the display section are described as an integrated configuration, but may also be configured to be independent from each other.

FIG. 2 shows a configuration of planar Luneburg lens 1 which is an emission direction separation section. In planar Luneburg lens 1, metal waveguides 12 are provided on each of up and down sides of the lens. For example, when dielectric 11, whose thickness is changed as shown in FIG. 3, is provided between metal waveguides 12, the effective dielectric constant can be changed, so that, similarly to the spherical Luneburg lens, the energy of electromagnetic waves can be converged at each different position depending on each direction of arrival of electromagnetic waves. In the thickness of the lens in which the relative dielectric constant is set as $\varepsilon_r$, and the radius is set as Radius, and in which the distance from the center of the lens is set as r, and the height of the metal parallel plate of the lens is set as d, effective dielectric constant $\varepsilon_s$ and thickness t of the dielectric constant at distance r are respectively expressed by [MATH. 1] and [MATH. 2].

[Expression 1]

$$\varepsilon_s(r) = \frac{d - t(r) + \varepsilon_r \cdot t(r)}{d} \qquad \text{[MATH. 1]}$$

[Expression 2]

$$t(r) = \frac{d\left(1 - \left(\frac{r}{\text{Radius}}\right)^2\right)}{\varepsilon_r - 1} \qquad \text{[MATH. 2]}$$

FIG. 4 shows propagation characteristics of radio waves when the electromagnetic waves are irradiated front the front upper direction of the lens in the configuration. The energy of the electromagnetic waves incident from the upper direction is gradually bent in the inside of the planar lens, so that the energy is converged to the central portion of the opposite side of the lens. Electric field sensor 2 is provided with a plurality of sensors, each of which detects the energy of electromagnetic waves emitted from planar Luneburg lens 1 and outputs an intensity detection signal corresponding to the amount of the detected energy.

Therefore, the sensor, located at the position corresponding to the convergence position (focal point) of the electromagnetic waves incident on the lens, outputs a detection signal, such as a voltage or electric power. That is, the sensor, which outputs a detection signal, is different according to the convergence position of electromagnetic waves incident on the lens.

Further, the result of the electromagnetic wave direction of arrival, estimated based on the detection signal of electric field sensor 2, is superimposed on the image captured by camera 7, and thereby visualization of the electromagnetic wave direction of arrival is realized.

Here, the electromagnetic wave measurement principle on which each of the sensors of electric field sensors 2 of the present embodiment bases is described below. The electric field sensor of the present embodiment is realized, for example, by a structure formed by periodically arranging metal pieces each formed in a mushroom-shape. The structure, formed by periodically arranging metal pieces each formed in a mushroom-shape, is widely used, because electric capacitor and electric inductance, which realize low reflection, can be controlled by the size of the mushroom-shape.

As shown in FIG. 5 and FIG. 6, metal pieces 201 are periodically arranged on the first layer that is the surface of plate-shaped dielectric 204. More precisely, a plurality of metal pieces 201 are arranged in the row direction (lateral direction) and the column direction (vertical direction) to form a grid pattern. Each pair of adjacent metal pieces 201 are connected to each other by resistor 202 and capacitor 203. Further, via 205 described below is provided at the center of each of metal pieces 201.

Each of metal pieces 201 has a size sufficiently smaller than the wavelength λ of electromagnetic waves to be measured, and the length of one side of metal piece 201 is set to (1/10) λ or less. For example, when the frequency of electromagnetic waves to be measured is 2.4 GHz, the length D of one side of metal piece 201, as shown in FIG. 6, is equal to or less than 12.5 mm. In the present embodiment, metal piece 201 is a square metal plate, but the shape of metal piece 201 is not limited to the square shape.

FIG. 7 is a sectional view taken along line a in FIG. 6. Ground (GND) 206, which is a conductor that is a second layer facing the first layer, and which has a surface substantially equal in size to the surface of dielectric 204, is provided on the lower surface of dielectric 204. GND 206 is connected to each of metal pieces 201 by via 205, which is a conductor extending through dielectric 204.

Further, voltage detection via 225, which detects a voltage induced between both ends of resistor 203, is connected to a detection circuit. The voltage detection circuit, which is signal detection section 3 shown in FIG. 1, is configured, for example, by an amplifier, an AD converter, a voltage measuring instrument, and the like.

When electromagnetic waves are irradiated onto one of metal pieces 201 configuring a low-reflection electromagnetic sheet, a voltage is induced only by resistor 202 connected to metal pieces 201 onto which the electromagnetic waves are irradiated. Therefore, the direction of arrival of the electromagnetic waves can be known from the voltage detection position of the voltage detection circuit connected to resistor 202.

At this time, when the impedance of resistor 202 is set to 377Ω equal to the wave impedance, the space impedance and the impedance of electric field sensor 2 match with each other, so that, since the electromagnetic waves are not reflected, the energy of the electromagnetic waves is absorbed by electric field sensor 2. At this time, it may also be configured such that, without providing resistor 202 for impedance matching, a matching circuit matching with the wave impedance of 377Ω is provided on the side of the voltage detection circuit.

The impedance matching is further described. When, in two-cells of metal pieces 201 described in FIG. 6, the width of metal piece 201 is set as D, the distance between the metal pieces is set as w, and the height between the metal piece and the GND layer is set as h, two-cells of metal piece 201 can be expressed by an equivalent circuit shown in FIG. 8. Here, parasitic capacitor C and parasitic inductances L can be respectively obtained by [MATH. 3] and [MATH. 4].

[Expression 3]

$$C = \frac{D\varepsilon_0(\varepsilon_r + 1)}{\pi} \cosh^{-1}\left(\frac{D+w}{w}\right) \quad \text{[MATH. 3]}$$

[Expression 4]

$$L = \mu_0 h \quad \text{[MATH. 4]}$$

Here, $Z_{Air}$ in FIG. 8 represents the wave impedance of air, and $R_2$ represents the input resistor of the voltage detection circuit. In addition to the fixed capacitor, a variable capacitor may be used as capacitor 203. The capacitance value of the variable capacitor is changed by a bias voltage value applied between both ends of the capacitor element.

In order that the electric field sensor is in a non-reflective state, inductance L and capacitor (C+$C_{add}$) may be in parallel resonance at a desired frequency, resistor R may be set to 377Ω equal to wave impedance $Z_{Air}$. The resonance frequency at this time can be obtained by [MATH. 5].

[Expression 5]

$$f = \frac{1}{2\pi\sqrt{LC}} \quad \text{[MATH. 5]}$$

In order to satisfy the conditions at the desired frequency, electric constant $C_{add}$ of capacitor 203 may be determined.

Further, when the frequency is required to be made variable, the capacitance value may be changed by applying a voltage to the variable capacitor.

However, as shown in FIG. 2, it is necessary that a metal waveguide is provided at each of up and down portions of the two-dimensional Luneburg lens. For this reason, it is necessary to use an EBG type electric field sensor having a structure which is suitable for a Luneburg lens having metallic waveguides. A structure of the present embodiment considering these will be described with reference to FIG. 9 to FIG. 11.

FIG. 9 is a detail view of a waveguide type EBG electric field sensor which is used for the present embodiment, and which is configured by metal pieces 201 periodically arranged on dielectric 204, resistor 202 and capacitor 203 each connected between each pair of adjacent metal pieces 201, and via 205 connected between each of metal pieces 201 and second layer GND.

Similarly to FIG. 7, voltage detection via 225 is provided to each of both ends of resistor 202, and voltage detection via 225 is not connected to second layer GND but is connected to the third layer. As shown in FIG. 9, the electric field sensor is configured such that metal waveguide 12 of the Luneburg lens is positioned at the center of the metal pieces forming the periodic structure. This structure acts as if there are electrically folded periodic structures due to electric image.

FIG. 10 shows the equivalent circuit of the portion which is represented by dotted lines b and which includes the electric image of the portion in contact with waveguide 12. When end portion resistor 212 and end portion capacitor 213 are respectively set as R' and $C_{add}'$, it seems, by the electric image, such that each of a pair of end portion resistors 212 of R' and a pair of end portion capacitors 213 of $C_{add}'$ are arranged side by side. For this reason, when R' is set as R'=2×377Ω, and $C_{add}'$ is set as $C_{add}'=C_{add}/2$, the equivalent circuit of FIG. 10 is equivalent to the equivalent circuit of FIG. 8.

FIG. 11 shows electromagnetic wave reflection characteristics of this structure. In FIG. 11, the reflection characteristic of each of electric field sensors, in which two to four cells of the metal pieces are respectively arranged side by side between the metal waveguides, are compared with the reflection characteristic of an electric field sensor having an infinite periodic structure formed of the metal pieces. The number of the cells of metal pieces, each of which is in contact with the metal waveguide and has half size, is counted as ½. From FIG. 11, it can be seen that, the low reflection characteristics similar to the low reflection characteristic of the electric field sensor having the infinite periodic structure are obtained.

FIG. 12 and FIG. 13 respectively show examples in each of which the direction of arrival of electromagnetic waves is estimated in the configuration of the present embodiment. FIG. 12 is a view showing propagation characteristics of electromagnetic waves when the planar Luneburg lens is combined with the waveguide type electric field sensor, and when the incident angle of electromagnetic waves incident from the front direction of the lens is changed from 0 degree to 10 degrees. The waveguide type electric field sensor having three cells of metal pieces is provided on the plane perpendicular to the incident angle of 0 degree of the lens. The state, in which electromagnetic waves incident from each of the angles are absorbed by the electric field sensor, can be seen.

FIG. 13 shows the induced voltages in the electric field sensor. The horizontal axis represents the angle, and the vertical axis represents the cell position in the vertical axis direction. It can be seen that the sensor detects accurately in the range from 0 degree to 10 degrees, and that the direction of arrival of electromagnetic waves can be visualized.

In the present embodiment, the lens formed of the dielectric whose thickness is gradually changed is used as the planar Luneburg lens. However, other types of planer Luneburg lenses, such as a lens in which the effectual dielectric constant is changed by forming holes in a dielectric with a fixed thickness, or a lens in which the effectual dielectric constant is changed by providing a metal periodic structure on the surface of a dielectric.

As described above, with the present embodiment, the direction of arrival of electromagnetic waves, and the intensity of the electromagnetic waves can be detected by using the planar lens, and hence, it is possible to realize an electromagnetic wave detection apparatus which is smaller than the electromagnetic wave detection apparatus using a spherical lens or an aspheric lens. Further, it is possible to suppress the sensitivity in receiving electromagnetic waves from being reduced, and hence the arriving electromagnetic waves can be accurately detected.

Embodiment 2

FIG. 14 shows a second embodiment of the present invention. In the first embodiment, the waveguide type electric field sensor is provided on the plane perpendicular to the incident angle of 0 degree of the lens, but in the present embodiment, an electric field sensor is provided along the shape of the lens.

In the present embodiment, the sensor is provided along the shape of the lens shape so as to cover the half peripheral surface of the lens. In Embodiment 1, it is estimated that the energy of electromagnetic waves detected by the sensor arranged at a position separated from the lens surface is reduced as compared with the energy of electromagnetic waves detected by the sensor arranged on the lens surface. However, when the sensor is arranged at each of the focal points of the lens, the sensor can receive the greatest energy of electromagnetic waves, and hence the detection sensitivity can be improved. The lateral length of the sensor may be arbitrarily set.

Embodiment 3

Figure 15:
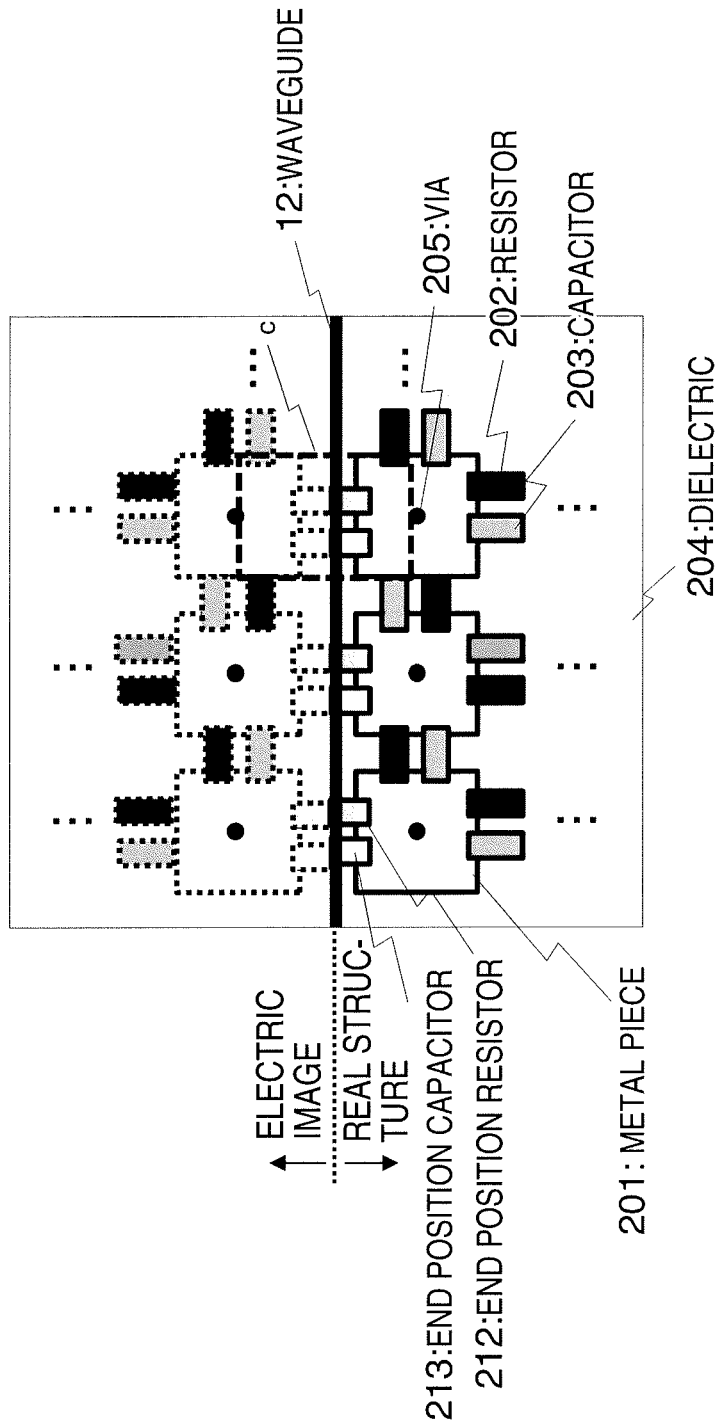
FIG. 15 is an overhead view showing an electric field sensor which is a sensor section according to a third embodiment of the present invention.
Figure 16:
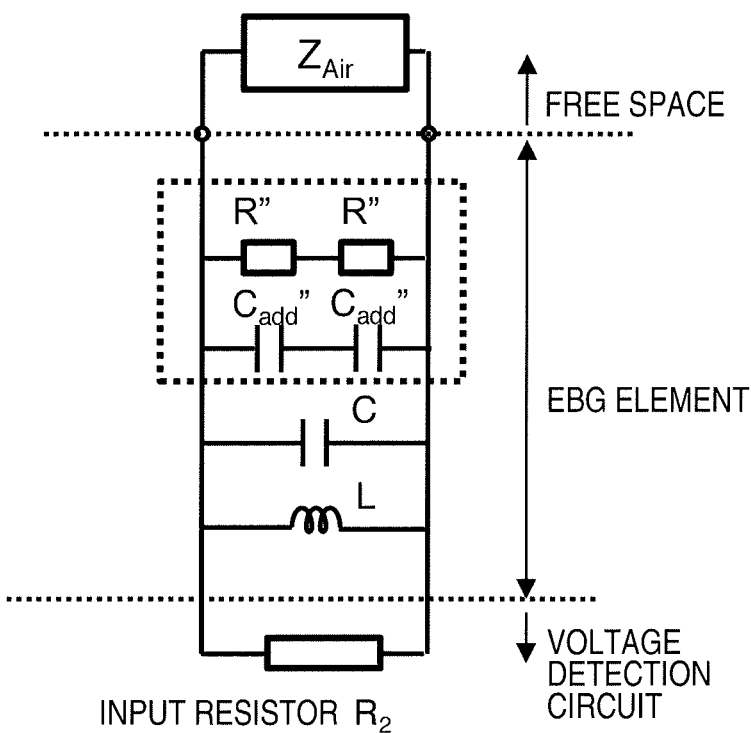
FIG. 16 is a view showing an equivalent circuit of the electric field sensor which is the sensor section according to the third embodiment of the present invention.

A third embodiment of the present invention will be described with reference to FIG. 15 to FIG. 17. FIG. 15 shows a waveguide type electric field sensor according to the third embodiment of the present invention. FIG. 15 is an overhead view of the waveguide type electric field sensor, which is configured such that metal waveguide 12 of the plane Luneburg lens is positioned at the center between the metal pieces arranged in the periodic structure.

The periodic structure metal pieces act as if there are electrically folded periodic structures due to electric image. FIG. 16 shows the equivalent circuit of the portion represented by dotted lines c and including the electric image of the portion in contact with waveguide 12. When end portion resistor 212 and end portion capacitor 213 are respectively set as R" and $C_{add}"$, it can be seem, by the electric image, such that each of a pair of portion resistors 212 of R" and a pair of portion capacitors 213 of $C_{add}"$ are arranged in series. For this reason, when R" is set as R"=377/2Ω, and $C_{add}"$ is set as $C_{add}"=2\times C_{add}$, the equivalent circuit of FIG. 16 is equivalent to the equivalent circuit of FIG. 8.

Figure 17:
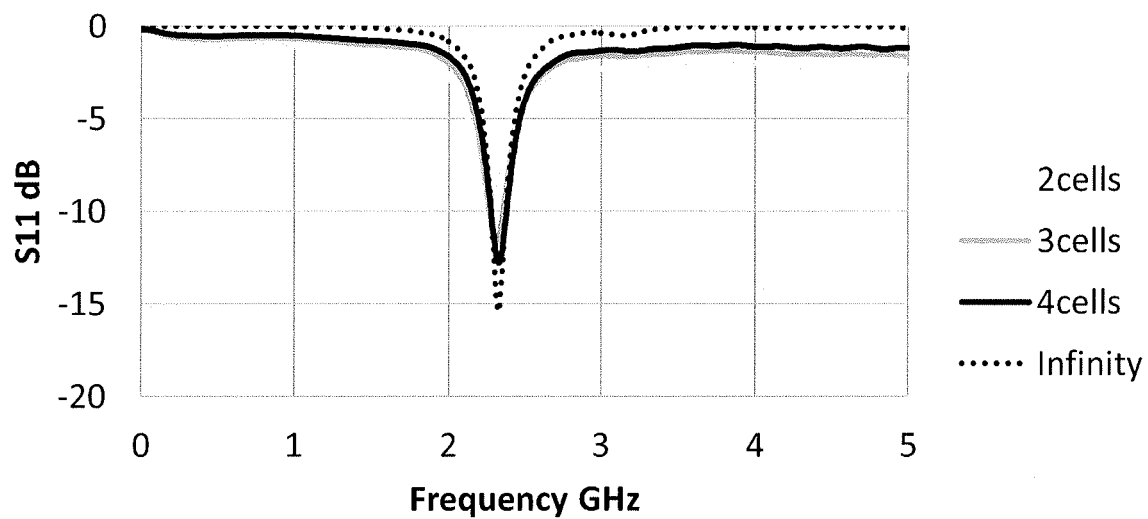
FIG. 17 shows analysis results of the electromagnetic wave reflection characteristics of the electric field sensor which is the sensor section according to the third embodiment of the present invention.

FIG. 17 shows electromagnetic wave reflection characteristics of this structure. The reflection characteristic of each of electric field sensors, each having two to four cells of metal pieces arranged side by side between the metal waveguides, is compared with the reflection characteristic of an electric field sensor having an infinite periodic structure of the metal pieces. From FIG. 17, it can be seen that the characteristics similar to the characteristic of the electric field sensor having the infinite periodic structure are obtained. When the number of cells is small, the resonance frequency is slightly changed from the design value, but the design is performed in consideration of the variation at the time of design.

It should be noted that the configuration of the electric field sensor of the present embodiment can be applied to each of the forms in which the electric field sensor is attached to the planar Luneburg lens described in Embodiment 1 and Embodiment 2.

Embodiment 4

Figure 18:
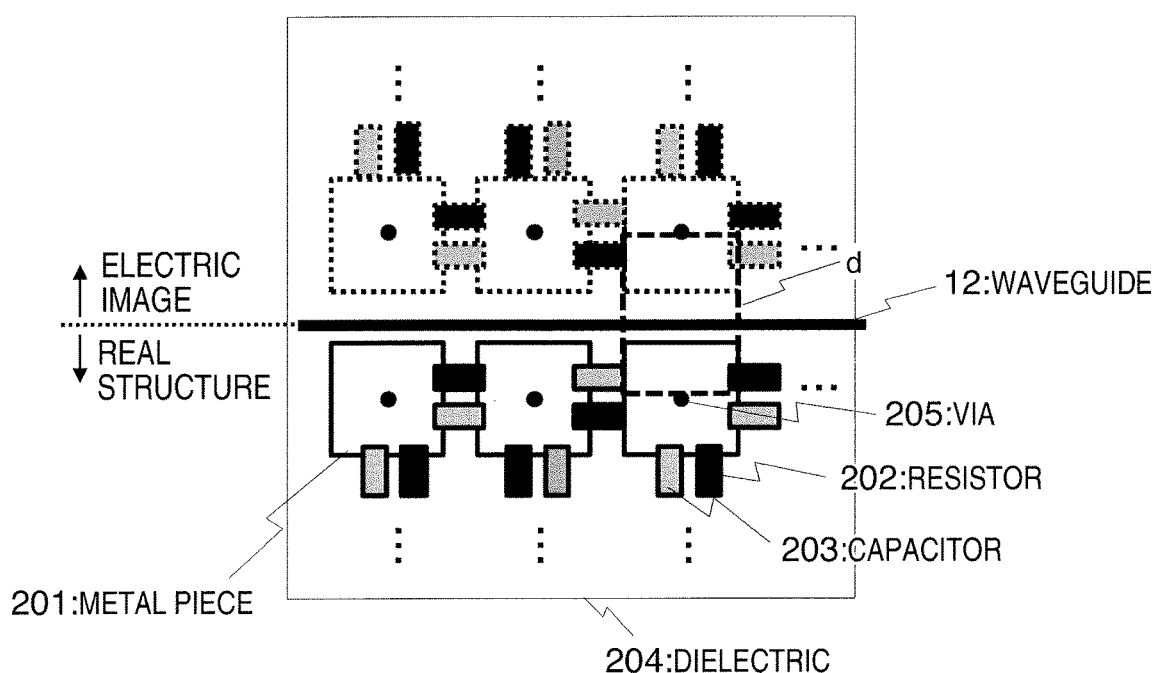
FIG. 18 is an overhead view showing an electric field sensor which is a sensor section according to a fourth embodiment of the present invention.
Figure 19:
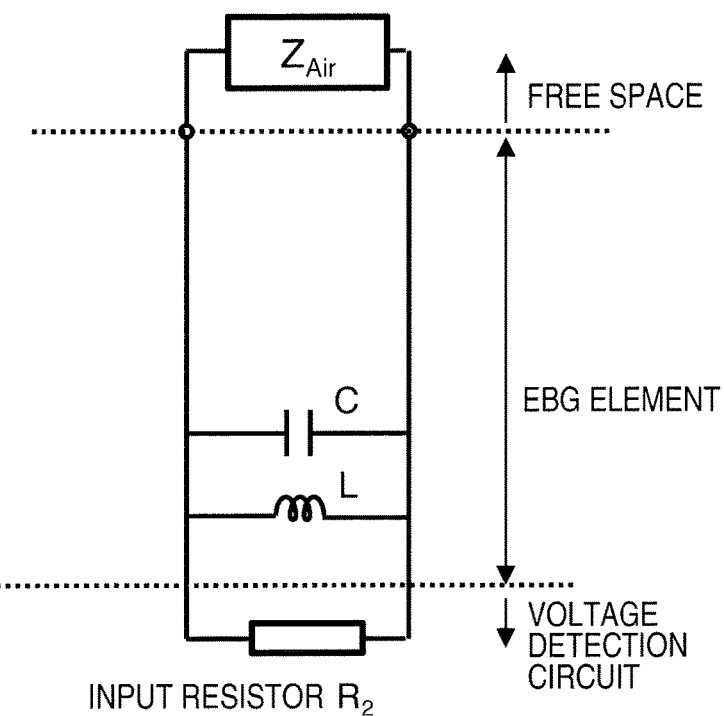
FIG. 19 is a view showing an equivalent circuit of the electric field sensor which is the sensor section according to the fourth embodiment of the present invention.
Figure 20:
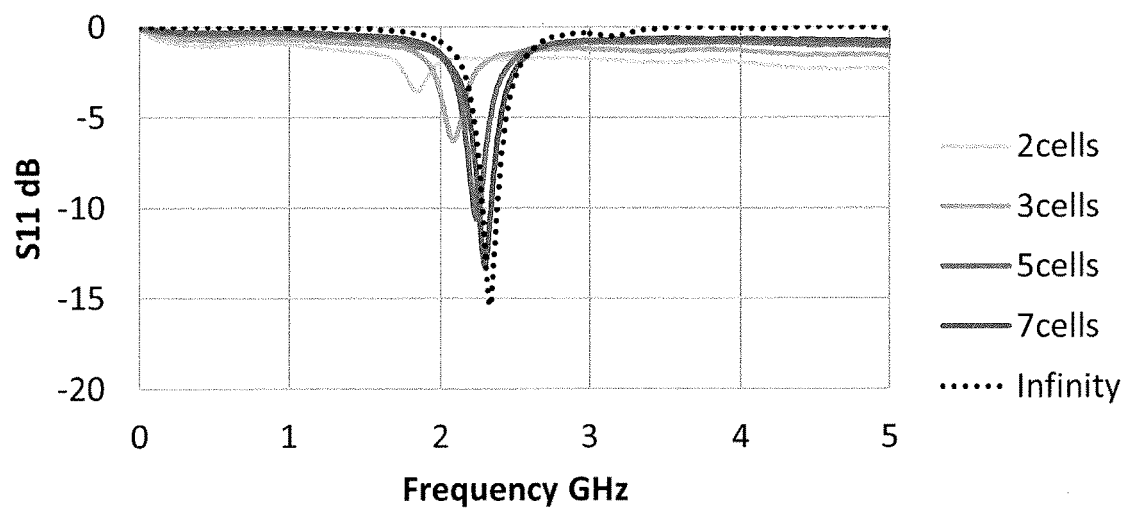
FIG. 20 shows analysis results of the electromagnetic wave reflection characteristics of the electric field sensor which is the sensor section according to the fourth embodiment of the present invention.

A fourth embodiment of the present invention will be described with reference to FIG. 18 to FIG. 20. FIG. 18 shows a waveguide type electric field sensor according to the fourth embodiment of the present invention. FIG. 18 is an overhead view of the waveguide type electric field sensor, which is configured such that metal waveguide 12 of a Luneburg lens is positioned at the center between metal pieces arranged in a periodic structure.

By electric imaging, it is seen that the periodic structure of metal pieces 201 is electrically folded. FIG. 19 shows the equivalent circuit of the portion represented by dotted lines d and including the electric image of the portion in contact with waveguide 12. Since it is seen that resistor 202 and capacitor 203 are not provided in the portion represented by dotted lines d, the equivalent circuit of the portion represented by dotted lines d is different from the equivalent circuit of the other periodic structure as shown in FIG. 8, and is configured, as shown in FIG. 19, such that only parasitic capacitor C and parasitic inductances L are in parallel resonance. When reflection characteristics are compared with each other, it can be seen that, as shown in FIG. 20, when the number of cells is small, the influence of the number of cells is large, and deviation of frequency and deterioration of reflection characteristics are caused.

When the waveguide type EBG electric field sensor having the present structure is used, the number of cells can be determined in consideration of the deviation of frequency and the degradation of reflection characteristics, and according to the reception sensitivity. Thereby, it is possible to provide an electromagnetic wave detection apparatus which is small and can suppress the degradation of reception sensitivity. It should be noted that the configuration of the electric field sensor of the present embodiment can be applied to any of the attachment forms of the electric field sensor used for the planar Luneburg lens described in Embodiment 1 and Embodiment 2.

Embodiment 5

Figure 21A:
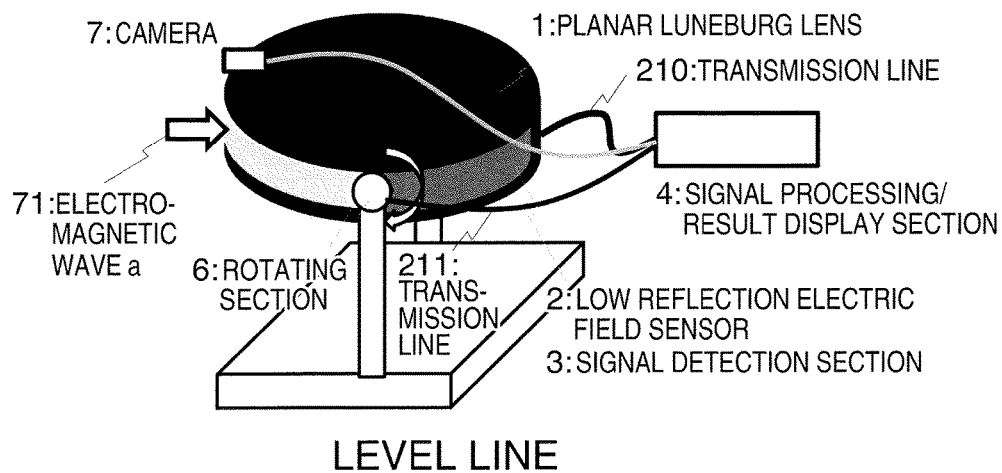
FIGS. 21A and 21B are a view showing a configuration of a separation function in the elevation direction of radio waves according to a fifth embodiment of the present invention.
Figure 21B:
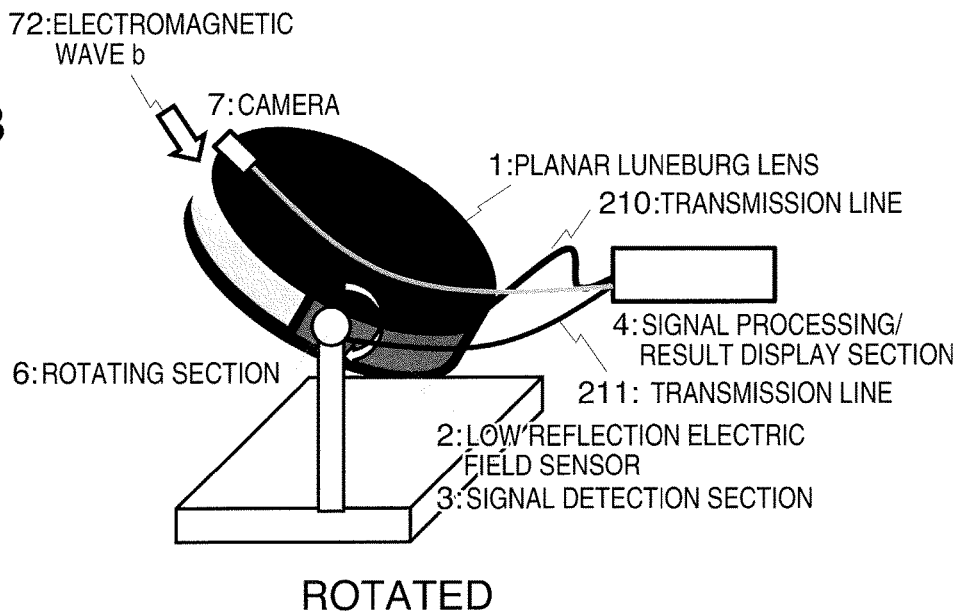

FIG. 21 shows a fifth embodiment of the present invention. In visualization of the direction of arrival of electromagnetic waves using the planar Luneburg lens and the electric field sensor, the direction of arrival of the azimuth angle can be separated, but the direction of arrival in the elevation direction θ cannot be separated.

Therefore, the electromagnetic wave detection apparatus of each of the first to fourth embodiments is provided with rotating section 6 which can be rotated in the elevation direction. Rotating section 6 is provided with, for example, a rotation control mechanism, and a rotation degree detection sensor. Information from the sensor is transmitted to signal processing/display section 4 via transmission line 211, so that information on the elevation angle direction θ is obtained.

The results of visualization of electromagnetic waves at an azimuth angle, information of the elevation angle θ, and an image acquired by camera 7 are combined in signal processing/display section 4, and thereby the direction of arrival of electromagnetic waves can be two-dimensionally estimated.

Embodiment 6

FIG. 22 shows a sixth embodiment of the present invention. Embodiment 5 is configured to mechanically realize an elevation direction separation function, but the elevation direction separation is electrically realized in the present embodiment. As shown in FIG. 22, leaky-wave antenna 8 as a beam scanning section is provided in front of the planar lens.

Figure 23:
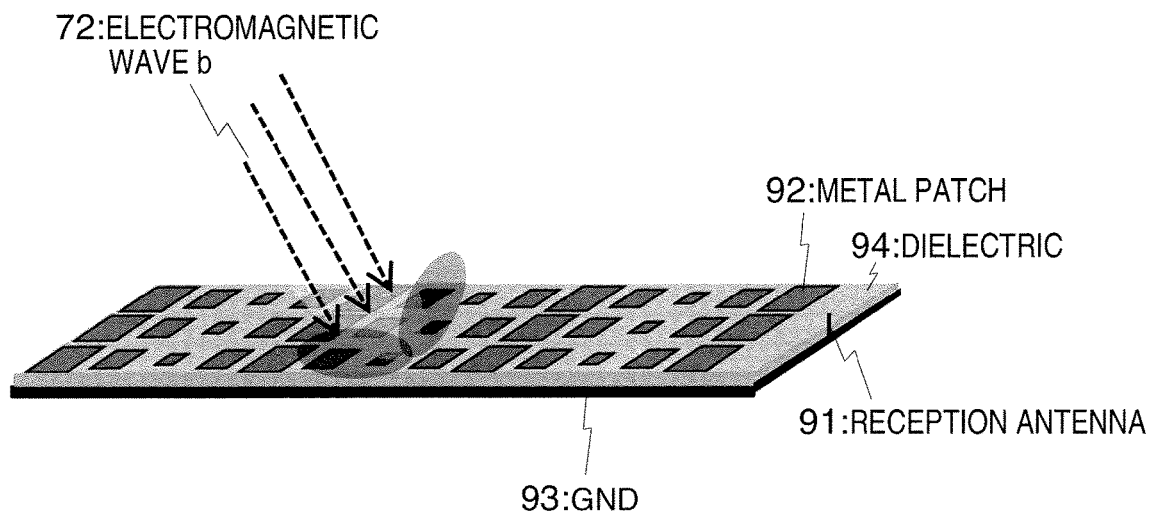
FIG. 23 is a view showing a configuration of a separation function in the elevation direction of radio waves according to the sixth embodiment of the present invention.

As shown in FIG. 23, leaky-wave antenna 8 is an antenna designed to control the phase of electromagnetic waves, for example, by a periodic structure of metal patches 92 provided on dielectric 94, to thereby have a strong directivity in a specific direction.

Figure 24:
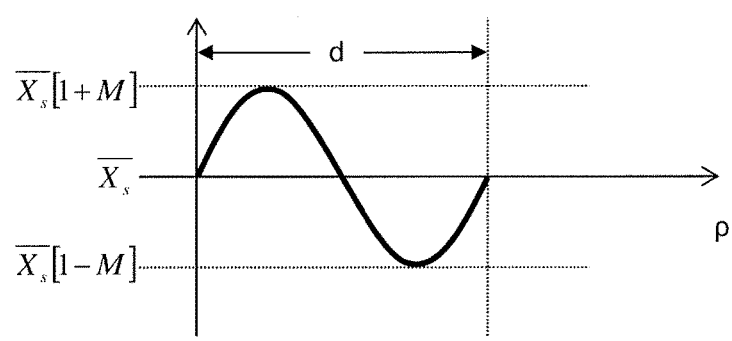
FIG. 24 is a view showing the change of reactance of a metal piece of a separation function section in the elevation direction of radio waves according to the sixth embodiment of the present invention.

An antenna with strong directivity can be realized in such a manner that the reactance determined by the periodic structure of metal patches is set as an average reactance value, and such that the metal periodic structure is designed to have the reactance modulated by a sine wave as shown in FIG. 24. When the wavelength is represented by λ, and one period of modulation of the periodic structure is represented by d, and when the air wave impedance is represented by and the incident angle is represented by θ, the relational expression representing the average reactance is given by [MATH. 6].

[Expression 6]

$$\overline{X_s} = \eta \sqrt{\left(\frac{\lambda}{d} - \sin|\theta|\right)^2 - 1}$$ [MATH. 6]

Further, the reactance at each position ρ on the substrate is given by [MATH. 7] when the modulation degree is represented by M.

[Expression 7]

$$X_s(\rho) = \overline{X_s}\left[1 + M\cos\left(\frac{2\pi}{d}\rho\right)\right]$$ [MATH. 7]

Figure 26:
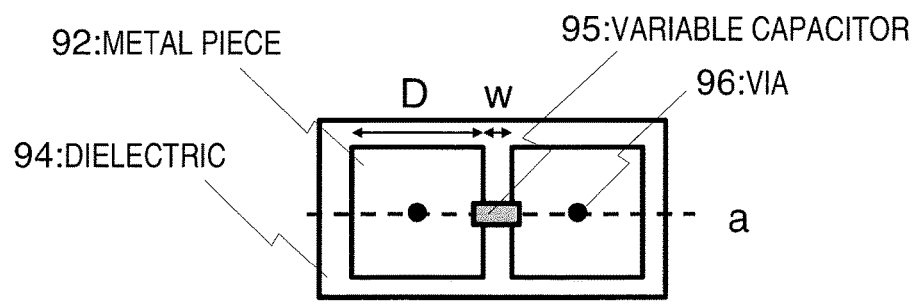
FIG. 26 is a partial overhead view showing the separation function section in the elevation direction of radio waves according to the sixth embodiment of the present invention.
Figure 27:
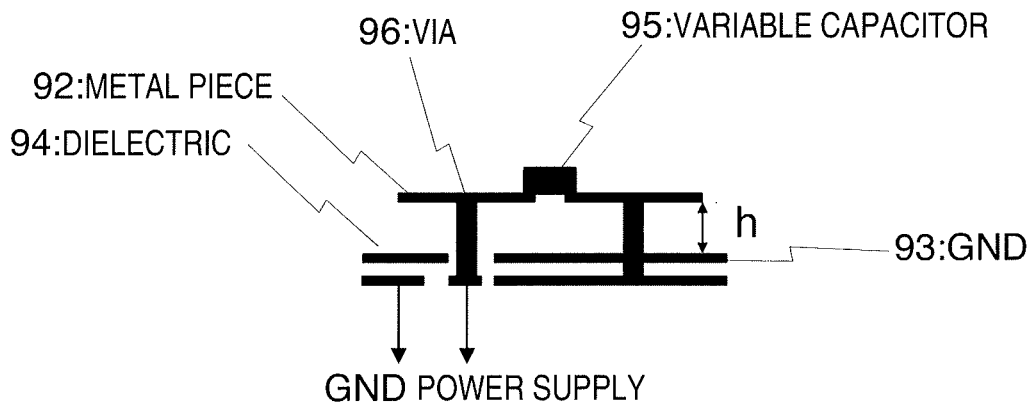
FIG. 27 is a partial sectional view showing the separation function section in the elevation direction of radio waves according to the sixth embodiment of the present invention.

In order to make directional angle θ variable in [MATH. 6], it is necessary to change the reactance. In the state where it is assumed that the structure of FIG. 26 is infinitely spread, when the width of the metal piece is represented by D, and the interval between the metal pieces is represented by w, and when the height of the metal piece from GND is represented by h, and the relative dielectric constant is represented by [Expression 8], the reactance can be obtained by [MATH. 8] to [MATH. 13].

[Expression 8]

$$Z_{grid} = -j\frac{\eta}{2}\frac{1}{\alpha}\frac{2}{\varepsilon_r + 1}$$ [MATH. 8]

[Expression 9]

$$\alpha = \frac{kD}{\pi}\ln\left(\frac{2D}{\pi w}\right)$$ [MATH. 9]

[Expression 10]

$$Z_s = \frac{Z_{grid}\tan(k'h)}{\tan(k'h) - j\frac{Z_{grid}}{\eta'}}$$ [MATH. 10]

[Expression 11]

$$k' = k\sqrt{\varepsilon_r}$$ [MATH. 11]

[Expression 12]

$$\eta' = \frac{\eta}{\sqrt{\varepsilon_r}}$$ [MATH. 12]

[Expression 13]

$$\overline{X_s} = Im(Z_s)$$ [MATH. 13]

Figure 25:
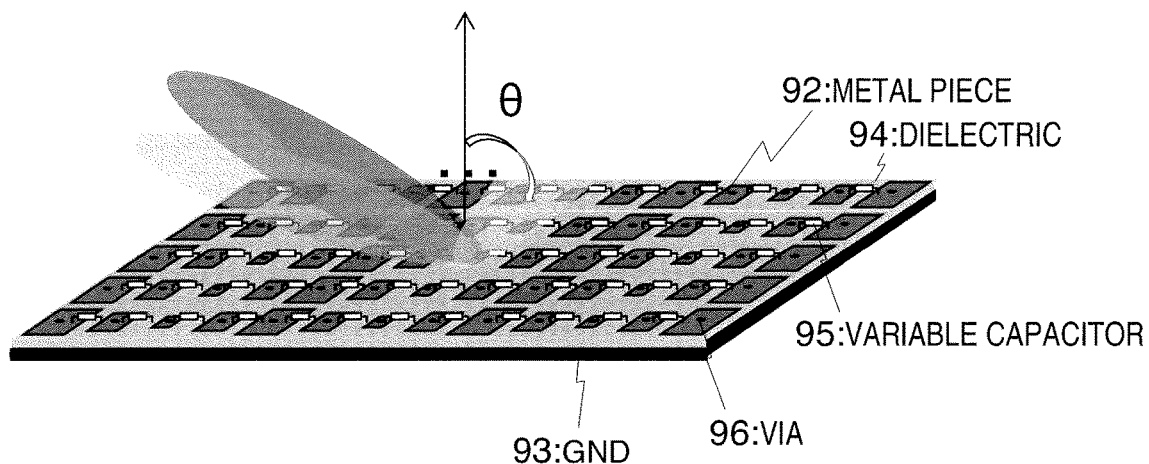
FIG. 25 is a view showing a configuration of the separation function section in the elevation direction of radio waves according to the sixth embodiment of the present invention.

That is, when the reactance is changed, the structure needs to be changed. However, it is very difficult to dynamically change the structure. Therefore, as shown in FIG. 25 and FIG. 26, a variable capacitor is provided between the metal patches, and the reactance of the capacitor is controlled.

Figure 28:
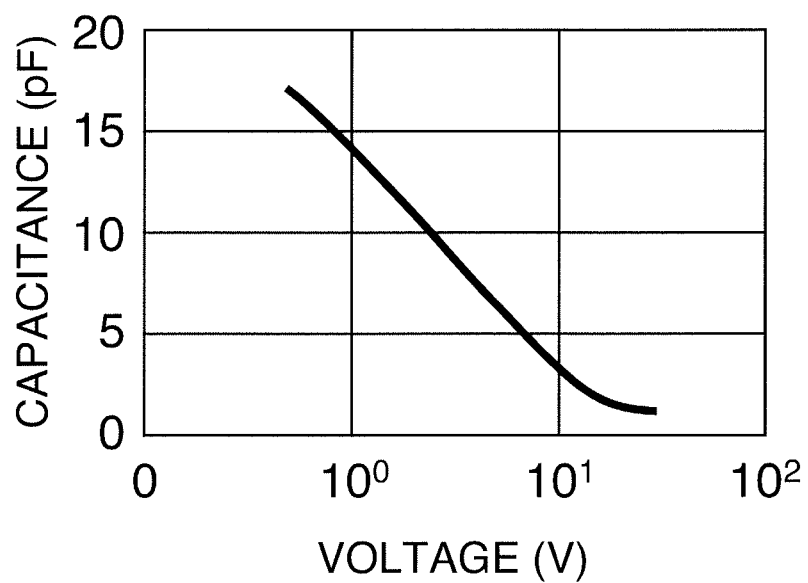
FIG. 28 shows an example of a capacitance change characteristic of variable capacitor with respect to voltage according to the sixth embodiment of the present invention.

Variable capacitor 95 is an element whose capacitance value is changed as shown in FIG. 28 when a voltage is applied between both ends of the element. The reactance of the periodic structure is changed by the variable capacitor, and thereby angle θ can be changed. The leaky-wave antenna section 8 is attached to the front surface of the lens as shown in FIG. 22, and thereby electromagnetic waves in the elevation direction can be separated.

In practice, the direction of arrival estimation of electromagnetic waves can be two-dimensionally performed in such a manner that a table representing the relationship between the voltage applied to variable capacitor 95 and elevation angle θ is provided, such that, while the voltage is controlled by voltage control section 5, the voltage is given to the variable capacitor, and such that information of elevation angle θ related with the voltage value, and the image of camera 7 are combined in signal processing/display section 4.

From the above, it is possible to realize an electromagnetic wave detection apparatus which is smaller than the electromagnetic wave detection apparatus using a spherical lens or an aspheric lens. Further, it is possible to suppress the sensitivity in receiving electromagnetic waves from being reduced, and hence arrival of electromagnetic waves can be accurately detected.

REFERENCE SIGNS LIST

1 Plane Luneburg lens
11 Dielectric
12 Waveguide
2 Electric field sensor
201 Metal piece 202 Resistor
203 Capacitor
204 Dielectric
205 Via
206 GND
210 to 212 Transmission line
225 Voltage detection via
3 Signal detection section
4 Signal processing/display section
5 Voltage control section
6 Rotating section
7 Camera
71 Electromagnetic wave a
72 Electromagnetic wave b
8 Beam scanning section leaky-wave antenna
91 Receiving antenna
92 Metal patch
93 GND
94 Dielectric
95 Variable capacitor
96 Via
901 Emission direction separation section
902 Sensor section
903 Signal detection section
904 Camera section
905 Signal processing/display section
933 Signal transmission line
911 Luneburg lens

The invention claimed is:

1. An electromagnetic wave detection apparatus comprising:
a planar Luneburg lens which is covered with metal plates facing each other and changes emission direction of electromagnetic wave according to incidence direction of the electromagnetic wave;
an electric field sensor electrically connected to the metal plate; and
a signal detection circuit connected to the electric field sensor,
wherein the electric field sensor detects electromagnetic wave emitted from the Luneburg lens, and outputs direction of arrival of the electromagnetic wave, and an intensity detection signal corresponding to amount of energy of the detected electromagnetic wave, and
wherein the electric field sensor is configured such that:
a plurality of metal pieces are provided on a surface layer of a plate-shaped dielectric,
each adjacent pair of the plurality of metal pieces are connected to each other by a resistor and a capacitor,
a ground via is provided at central portion of each of the metal pieces to face the surface layer and to be connected to a ground layer provided in the dielectric, and
a detection via connected to the signal detection circuit is connected between both ends of the resistor.

2. The electromagnetic wave detection apparatus according to claim 1, wherein
the metal plate is connected to metal piece of the electric field sensor, and each of the plurality of metal pieces provided at end portion of the electric field sensor has a structure obtained by cutting the metal piece in half along a center line of the metal piece.

3. The electromagnetic wave detection apparatus according to claim 1, wherein
distance between the metal plate and the metal piece provided at an end portion of the electric field sensor so as to be adjacent to the metal plate is half the distance between each adjacent pair of the metal pieces arranged in a periodic configuration.

4. The electromagnetic wave detection apparatus according to claim 3, wherein
the metal plate is connected to each of a resistor and a capacitor which are connected to the metal piece of the electric field sensor, and the length of each of the resistor and the capacitor is half the length of each of another resistor and another capacitor which are connected between the metal pieces.

5. The electromagnetic wave detection apparatus according to claim 1, comprising:
a signal processing section connected to the electric field sensor by a transmission line; and
a display section connected to the signal processing section to display information processed in the signal processing section,
wherein, when the signal processing section receives the detection signal, then, on the basis of sensor position information included in the detection signal, the signal processing section sends, to the display section, information on electromagnetic wave direction of arrival based on the position of the sensor, so that the information is displayed by the display section.

6. The electromagnetic wave detection apparatus according to claim 5, wherein
when intensity of the detection signal received from the sensor is not less than a predetermined value, the processing section sends, to the display section, the information on the direction of arrival of the electromagnetic wave, so that the information is displayed by the display section.

7. The electromagnetic wave detection apparatus according to claim 5, comprising
a camera section which captures an image of a measurement object and outputs an image signal of the captured image,
wherein: when the signal processing section receives the image signal from the camera section, and the detection signal from the sensor, the signal processing section outputs a display signal which includes the image signal, and electromagnetic wave direction of arrival that is obtained with reference to a table and from the position information of the sensor from which the detection signal is transmitted; and
when the display section receives the display signal, then, on the basis of the image signal and the electromagnetic wave direction of arrival information obtained based on the sensor position information, which are included in the display signal, the display section superimposes the electromagnetic wave direction of arrival information on the image of the image signal, to thereby display the electromagnetic wave direction of arrival.

8. The electromagnetic wave detection apparatus according to claim 5, comprising
a rotating section which rotates the electromagnetic wave detection apparatus connected to the signal processing section,
wherein: the rotating section outputs information on a rotation angle based on a reference position to the signal processing section; and the signal processing section sends, to the display section, rotation angle information, and the electromagnetic wave direction of arrival information basis on the position information of the sensor by which the electromagnetic wave are detected, and displays the electromagnetic wave direction of arrival information with the display section.

9. The electromagnetic wave detection apparatus according to claim 8, comprising
   a camera section which captures an image of a measurement object and outputs an image signal of the captured image,
   wherein: when the signal processing section receives the image signal from the camera section, and the detection signal from the sensor, the signal processing section outputs the display signal including the image signal and the electromagnetic wave direction of arrival obtained with reference to a table and from the position information of the sensor from which the detection signal is transmitted, and rotation information of the entire apparatus sent from the rotating section; and
   when the display section receives the display signal, then, on the basis of the image signal included in the display signal, and the electromagnetic wave direction of arrival information obtained on the basis of the sensor position information and the rotation information, the display section superimposes the electromagnetic wave direction of arrival information on the image obtained by the image signal, and thereby displays the electromagnetic wave direction of arrival.

10. The electromagnetic wave detection apparatus according to claim 5, comprising:
    a mechanism which electrically changes the direction of electromagnetic wave to be received; and
    a display section which displays the direction of arrival of the electromagnetic wave on the basis of the information on the reception directions and the position of the sensor.

11. The electromagnetic wave detection apparatus according to claim 10, comprising
    a camera section which captures an image of a measurement object and outputs an image signal of the captured image,
    wherein: when the processing section receives the image signal from the camera section, and the detection signal from the sensor, the processing section outputs the display signal including the image signal and the electromagnetic wave direction of arrival information obtained with reference to a table and from the position information of the sensor from which the detection signal is transmitted, and the information on the reception directions of the electromagnetic wave; and
    when the display section receives the display signal, then, on the basis of the image signal included in the display signal, and the electromagnetic wave direction of arrival information obtained on the basis of the sensor position information, the display section superimposes the electromagnetic wave direction of arrival information on the image obtained by the image signal, and thereby displays the electromagnetic wave direction of arrival.

* * * * *